(12) United States Patent
Kwon et al.

(10) Patent No.: US 7,046,089 B2
(45) Date of Patent: May 16, 2006

(54) VARIABLE GAIN AMPLIFIER

(75) Inventors: Chong Ki Kwon, Daejon-Shi (KR); Gyu Hyung Cho, Daejon-Shi (KR); Mun Yang Park, Daejon-Shi (KR); Jong Dae Kim, Daejon-Shi (KR)

(73) Assignee: Electronics and Telecommunications Research Institute, (KR)

( * ) Notice: Subject to any disclaimer, the term of this patent is extended or adjusted under 35 U.S.C. 154(b) by 15 days.

(21) Appl. No.: 10/731,610

(22) Filed: Dec. 8, 2003

(65) Prior Publication Data

US 2004/0135632 A1    Jul. 15, 2004

(30) Foreign Application Priority Data

Dec. 10, 2002    (KR) .................. 10-2002-0078446

(51) Int. Cl.
   *H03F 3/45* (2006.01)
(52) U.S. Cl. ...................... 330/254; 330/257
(58) Field of Classification Search .............. 330/254, 330/257, 261
   See application file for complete search history.

(56) References Cited

U.S. PATENT DOCUMENTS

| | | | |
|---|---|---|---|
| 5,757,230 A | | 5/1998 | Mangelsdorf |
| 6,657,494 B1 | * | 12/2003 | Twomey ...................... 330/254 |
| 6,710,659 B1 | * | 3/2004 | Teramoto et al. ........... 330/254 |

FOREIGN PATENT DOCUMENTS

| JP | 4160810 | 6/1992 |
|---|---|---|
| JP | 7147523 | 6/1995 |

OTHER PUBLICATIONS

"A 270 MHz, 1 V pk-pk, Low-Distortion Variable Gain Amplifier in 0.35 um CMOS process", S. Tan, et al., ESSCIRC 2002, pp. 307-310.
"High Frequency/high dynamic range CMOS VGA", W.C. Song, et al., Electronics Letters, Jun. 22, 2000, vol. 36, No. 13, pp. 1096-1098.

* cited by examiner

*Primary Examiner*—Khanh V. Nguyen
(74) *Attorney, Agent, or Firm*—Blakely Sokoloff Taylor & Zafman

(57) ABSTRACT

Disclosed is a CMOS variable gain amplifier. The variable gain amplifier comprises a first means for first and second differential input voltages, a second means for controlling its transconductance to generate an output current according to a control voltage, a third means for a bias voltage to generate bias current by current mirror, and to supply a stabilized bias current to the second means using the replica current, and a fourth means for generating an output voltage with a variable gain according to control voltage by its output current generated in the second means. Therefore, the present invention provides a function of controlling low distortion and high linearity in low voltage and a high-speed operation by the supply of a stabilized sharing current bias, and can control a voltage gain in a wide range by the control voltage.

9 Claims, 2 Drawing Sheets

VARIABLE GAIN AMPLIFIER

BACKGROUND OF THE INVENTION

1. Field of the Invention

The present invention relates to a CMOS variable gain amplifier (VGA), which can provide a function of controlling a gain of input signals with both low distortion and high linearity in a low voltage and a high-speed operating range by a stabilized sharing current bias.

2. Background of the Related Art

Performance parameters of VGA that must be considered in designing the CMOS variable gain amplifier may include maximum of signal-to-noise ratio (SNR) for a desired signal value, a frequency bandwidth, low distortion, the input signal level that guarantees desired linearity, noise characterisitcs, gain control range, and the like. Further, its dependence on the temperature variation or supply voltage can not be excluded. In particular, it is not easy to design a CMOS VGA circuit having the operating frequency range of over 100 MHz in view of device technology characteristics. Furthermore, due to limitations in reduction of the threshold voltage in the MOS device, the input/output signal level is limited. It is, thus, difficult to expect a smooth operation of VGA for a low power supply because of smaller input signal range.

Therefore, it is difficult to implement the CMOS variable gain amplifier with a low power consumption characteristics at the low voltage as an integrated circuit.

SUMMARY OF THE INVENTION

Accordingly, the present invention is contrived to substantially obviate one or more problems due to limitations and disadvantages of the related art.

An object of the present invention is to provide a CMOS variable gain amplifier that provides a function of variable gain a large input signal range according to the control voltage at a low supply voltage and has a wideband characteristic by a stabilized sharing current bias.

Another object of the present invention is to provide a CMOS variable gain amplifier with low power consumption, which can be implemented as IC.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a variable gain amplifier according to the present invention includes a first means for first and second differential input voltages, a second means for adjusting the transconductances of MOS transistors for generating an output current according to a control voltage, a third means for a bias current by current mirror, and to supply a stabilized bias current to the second means using the replica current, and a fourth means for generating an output voltage with a variable gain according to control voltage by its output current generated in the second means.

In another aspect of the present invention, it is to be understood that both the foregoing general description and following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE EMBODIMENTS

Figure 1:
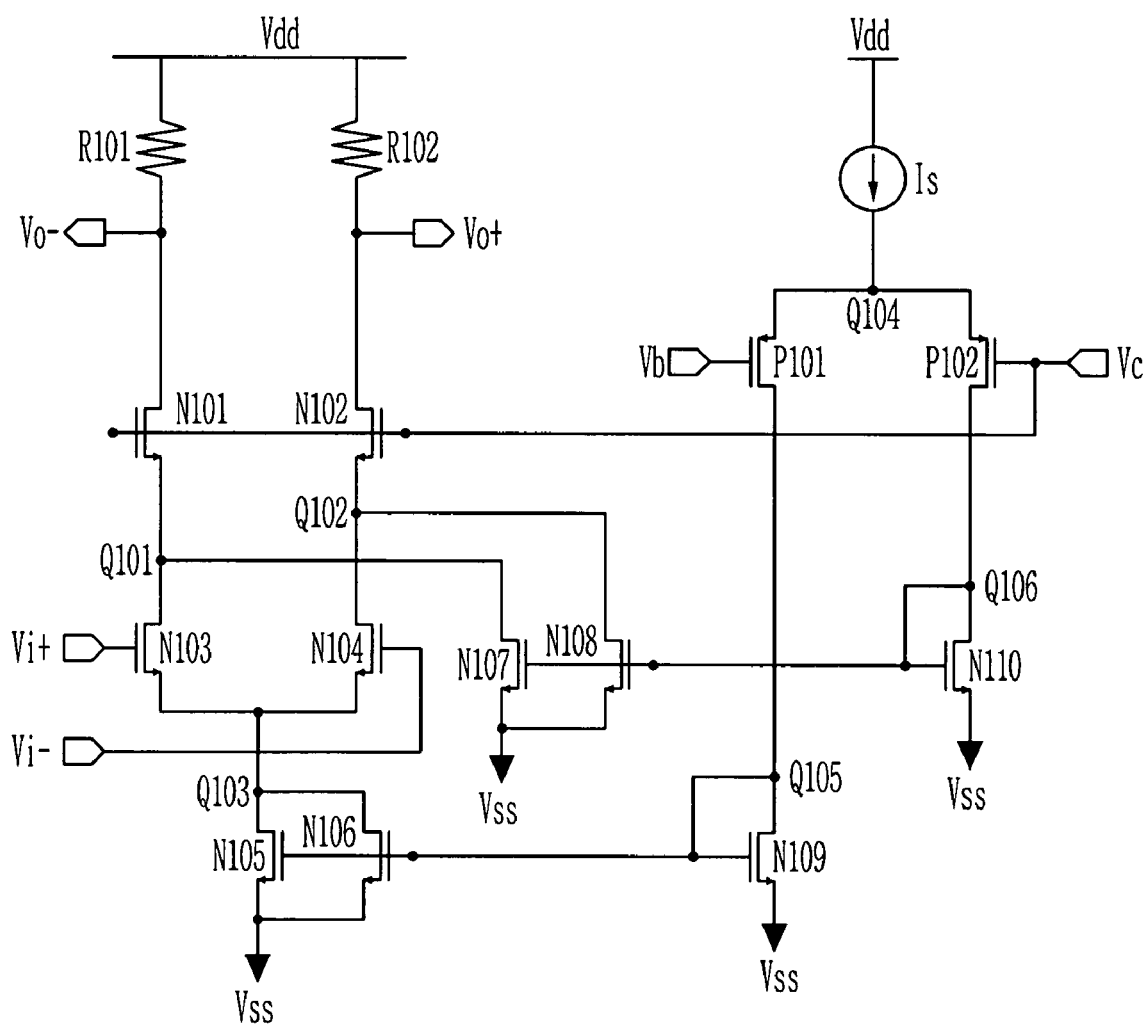
FIG. 1 is a circuit diagram illustrating the construction of a CMOS variable gain amplifier with a stabilized current bias according to a preferred embodiment of the present invention.

Reference will now be made in detail to the preferred embodiments of the present invention, examples of which are illustrated in the accompanying drawings, in which like reference numerals are used to identify the same or similar parts.

FIG. 1 is a circuit diagram illustrating the construction of a CMOS variable gain amplifier with low distortion, high linearity, low voltage operation and high-speed operation by the supply of a stabilized current bias according to a preferred embodiment of the present invention. The construction of the CMOS variable gain amplifier will be described below in detail with reference to FIG. 1.

A first resistor R101 and a first NMOS transistor N101 are connected in series between the power supply terminal Vdd and a first node Q101. A second resistor R102 and a second NMOS transistor N102 are connected in series between the power supply terminal Vdd and a second node Q102. The first and second NMOS transistors N101 and N102 are controlled in those transconductance according to the control voltage (Vc), thus generating variable output currents. The output currents generated by the first and second NMOS transistors N101 and N102 are converted into output voltages by the first resistor R101 and the second resistor R102 and are then outputted through a first output terminal Vo– and a second output terminal Vo+. A third NMOS transistor N103 connected between the first node Q101 and the third node Q103 and driven by a first input voltage (Vi+), and a fourth NMOS transistor N104 connected between the second node Q102 and the third node Q103 and driven by a second input voltage (Vi–) are constructed in a differential pair shape. Fifth and sixth NMOS transistors N105 and N106, which are driven by the potential of a fifth node Q105, are connected in parallel between the third node Q103 and the ground terminal Vss. A seventh NMOS transistor N107 connected between the first node Q101 and the ground terminal Vss and an eighth NMOS transistor N108 connected between the second node Q102 and the ground terminal Vss are driven by the potential of a sixth node Q106. A current source (Is) is connected between the power supply terminal Vdd and a fourth node Q104. A first PMOS transistor P101 connected between the fourth node Q104 and the fifth node Q105 and driven by a bias voltage (Vb) and a second PMOS transistor P102 connected between the fourth node Q104 and the sixth node Q106 and driven by a control voltage (Vc), are constructed in a differential shape.

A ninth NMOS transistor N109 connected between the fifth node Q105 and the ground terminal Vss and driven by the potential of the fifth node Q105 and a tenth NMOS transistor N110 connected between the sixth node Q106 and the ground terminal Vss and driven by the potential of the sixth node Q106 are constructed in a current mirror shape.

The method of driving the variable gain amplifier constructed above will now be described.

If constant bias voltage (Vb) and constant control voltage (Vc) are complementally applied from the outside, the current from the current source (Is) is supplied to the fifth and sixth nodes Q105 or Q106, both constituting the input stage in the current mirror shape, through the first and second PMOS transistors P101 or P102. The fifth, sixth and ninth NMOS transistors N105, N106 and N109, and the seventh, eighth and tenth NMOS transistor N107, N108 and N110 are each driven by the current supplied to the fifth and sixth nodes Q105 and Q106.

Meanwhile, the transconductances of the first and second NMOS transistors N101 and N102 are controlled by the control voltage (Vc). The output currents of the first and second NMOS transistors N101 and N102 are generated by the first input voltage (Vi+) and the second input voltage (Vi−) that differentially drive the third and fourth NMOS transistor N103 and N104, respectively. These output currents are converted into the output voltages by means of the first and second resistors R101 and R102 and are then outputted as the first and second output voltages (Vo− and Vo+).

In the above, the first and third NMOS transistors N101 and N103, or the second and fourth NMOS transistors N102 and N104 maintains a cascode shape to have a high output impedance at the first and second output terminals Vo− and Vo+, respectively. For this reason, the voltage gain is made high. Also, the first and second NMOS transistors N101 and N102 are always operated in a saturation region depending on the value of the control voltage (Vc), while the third and fourth NMOS transistors N103 and N104 to which the first input voltage (Vi+) and the second input voltage (Vi−) are applied operate in a triode region or the saturation region. In other words, if the value of the control voltage (Vc) is lower than a reference voltage (Vb), the first and second NMOS transistors N101 and N102, and the third and fourth NMOS transistors N103 and N104 both operate in the saturation region. On the contrary, if the value of the control voltage (Vc) is higher than a reference voltage (Vb), the first and second NMOS transistors N101 and N102 operate in the saturation region but the third and fourth NMOS transistors N103 and N104 operate with moving those operating point from in the saturation region to in the triode region.

Accordingly, the CMOS variable gain circuit of the present invention is made to have a control signal mode that makes low the control signal (Vc) when a high differential input voltage [(Vi+)−(Vi−)] is applied, so that both the two transistors N101 and N103 or N102 and N104 having a cascod connection operate in the saturation region. The CMOS variable gain circuit of the present invention is made to have a control signal mode that makes high the control signal (Vc) when a low differential input voltage [(Vi+)−(Vi−)] is applied, so that only the two transistors N103 and N104 to when the differential input signals are applied operate in the triode region. It is thus possible to maximize the linearity regardless of the control voltage.

In other words, if the control voltage (Vc) is lower than the reference bias voltage (Vb), the current is supplied to the sixth node Q106 along the current bias supply path. The tenth NMOS transistor N110 and the seventh and eighth NMOS transistors N107 and N108 are thus driven. Therefore, a lower voltage gain with a sharing constant bias regardless of control voltage (Vc) is acquired and the voltage gain, whereby the first output terminal Vo− and the second output terminal Vo+ are always stabilized. On the contrary, if the control voltage (Vc) is higher than the bias voltage (Vb), the current is applied to the fifth node Q105 along the current bias supply path. The ninth NMOS transistor N109 and the fifth and sixth NMOS transistors N105 and N106 are thus driven. Therefore, as the higher variable voltage gain can be obtained. Furthermore, as a constant and stabilized sharing current bias is maintained by the fifth and sixth NMOS transistors N105 and N106 or the seventh and eighth NMOS transistors N107 and N108, which have the same value, good linearity and frequency characteristic can be accomplished.

Figure 2:
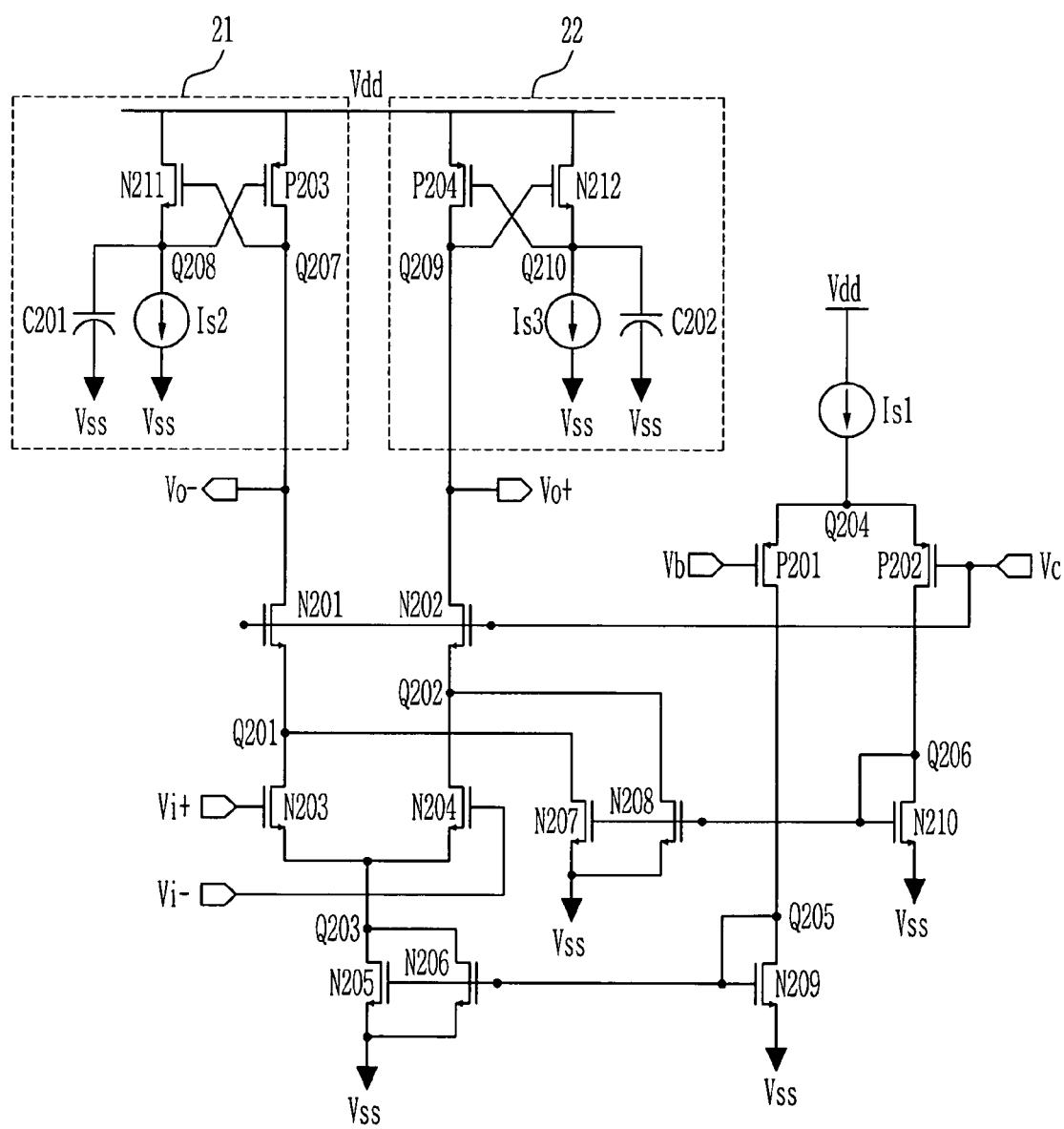
FIG. 2 is a circuit diagram illustrating the construction of a CMOS variable gain amplifier with both a stabilized current bias and an active load according to another preferred embodiment of the present invention.

FIG. 2 is a circuit diagram illustrating the construction of a variable gain amplifier in which the active load is used as the output load in lieu of the resistor in order to improve the frequency characteristic according to another preferred embodiment of the present invention.

A first active load 21 and a first NMOS transistor N201 are serially connected between the power supply terminal Vdd and a first node Q201. A second active load 22 and a second NMOS transistor N202 are serially connected between the power supply terminal Vdd and a second node Q202. In the above, the first and second NMOS transistors N201 and N202 are controlled in transconductance according to a control voltage (Vc), thus generating output currents.

In the above, the first active load 21 includes a third PMOS transistor P203 connected between the power supply terminal Vdd and a seventh node Q207 and driven by the potential of an eighth node Q208, an eleventh NMOS transistor N211 connected between the power supply terminal Vdd and the eighth node Q208 and driven by the potential of the seventh node Q207, and a second current source (Is2) and a first capacitor C201, which are connected in parallel between the eighth node Q208 and the ground terminal Vss.

Furthermore, the second active load 22 includes a fourth PMOS transistor P204 connected between the power supply terminal Vdd and a ninth node Q209 and driven by the potential of a tenth node Q210, a twelfth NMOS transistor N212 connected between the power supply terminal Vdd and the tenth node Q210 and driven by the potential of the ninth node Q209, and a third current source (Is3) and a second capacitor C202, which are connected in parallel between the tenth node Q210 and the ground terminal Vss.

Meanwhile, the output currents generated by the first and second NMOS transistors N201 and N202 are converted into the output voltages by the first and second active loads R201 and R202, and are then outputted through a first output terminal Vo− and a second output terminal Vo+. A third NMOS transistor N203 connected between the first node Q201 and the third node Q203 and driven by a first input voltage (Vi+), and a fourth NMOS transistor N204 connected between the second node Q202 and the third node Q203 and driven by a second input voltage (Vi−), are constructed in a differential pair shape. Fifth and sixth NMOS transistors N205 and N206, which are driven by the potential of a fifth node Q205, are connected in parallel between the third node Q203 and the ground terminal Vss. A seventh NMOS transistor N207 connected between the first node Q201 and the ground terminal Vss and an eighth NMOS transistor N208 connected between the second node Q202 and the ground terminal Vss are driven by the potential of a sixth node Q206. A current source (Is) is connected between the power supply terminal Vdd and a fourth node Q204. A first PMOS transistor P201 connected between the fourth node Q204 and the fifth node Q205 and driven by a bias voltage (Vb) and a second PMOS transistor P202 connected between the fourth node Q204 and the sixth node Q206 and driven by a control voltage (Vc), are constructed in the differential shape. A ninth NMOS transistor N209 connected between the fifth node Q205 and the ground terminal Vss and driven by the potential of the fifth node Q205 and a tenth NMOS transistor N210 connected between the sixth node Q206 and the ground terminal Vss and driven by the potential of the sixth node Q206, are constructed in a current mirror shape.

The variable gain amplifier constructed above according to the present invention operates in the same manner to those described with reference to FIG. 1. In FIG. 2, the active load is used in lieu of the resistor for implementing the output voltage in order to supply a stabilized bias and improve a frequency characteristic. Due to this, the variable gain amplifier in FIG. 2 can operate in a wideband than the load constructed using the resistor. Further, there is an advantage that the variable gain amplifier can operate in a high frequency region by the use of the frequency compensation capacitors (C201 and C202). The frequency characteristic of the above circuit is dependent on parasitic capacitance at the drain stages of the third and fourth PMOS transistors P203 and P204 in the active load. Accordingly, a good frequency characteristic is accomplished by optimizing the size of the constitutional device.

Therefore, the CMOS variable gain amplifier according to the present invention has advantages that it has low distortion and high frequency bandwidth characteristics by the supply of the stabilized current bias and can be embedded into the MOS integrated circuit.

As described above, the present invention has new effects that it provides a variable gain amplifier having low distortion and high frequency bandwidth characteristics by the supply of a stabilized sharing current bias in low control range, which operates at high speed and allows the variable gain amplifier to be embedded into the integrated circuit. Further, the present invention has advantageous effects that it can minimize the area due to simple construction and allows a low supply voltage or an operation mode control setting if necessary.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed are:

1. A variable gain amplifier, comprising:
   a first means for first and second differential input voltages;
   a second means for generating an output current, according to a control voltage that controls transconductance of the second means;
   a third means for maintaining a stabilized bias current by current mirror and for supplying the stabilized bias current to the second means; and
   a fourth means for generating an output voltage with a variable gain according to the control voltage by the output current generated in the second means,
   wherein the third means further comprises:
      a current source for supplying a given current,
      a first PMOS transistor driven by a bias voltage, for supplying the current from the current source, and
      a second PMOS transistor driven by the control voltage, for supplying the current from the current source.

2. The variable gain amplifier as claimed in claim 1, wherein the first means comprises:
   a first NMOS transistor driven by the first input voltage; and
   a second NMOS transistor driven by the second input voltage, wherein source terminals of the first and second NMOS transistors are interconnected.

3. The variable gain amplifier as claimed in claim 1, wherein the second means comprises first and second NMOS transistors connected between the first means and the fourth means, and the transconductance of each of the first and second NMOS transistors is controlled by the control voltage.

4. The variable gain amplifier as claimed in claim 1, wherein the third means further comprises:
   first and second NMOS transistors each connected between the second means and the ground terminal and driven by the current supplied through the second PMOS transistor; and third and fourth NMOS transistors connected in parallel between the first means and the ground terminal and driven by the current supplied through the first PMOS transistor.

5. The variable gain amplifier as claimed in claim 1, wherein the fourth means is a resistor.

6. The variable gain amplifier as claimed in claim 1, wherein the fourth means comprises:
   a third PMOS transistor connected between a power supply terminal and an output terminal and driven by the potential of a first node;
   a NMOS transistor connected between the output terminal and the first node and driven by the output terminal; and
   a capacitor and a current source each connected in parallel between the first node and the ground terminal.

7. A variable gain amplifier, comprising:
   first and second NMOS transistors driven by first and second input voltages, respectively, wherein one terminal of each of the first and second NMOS transistors is commonly connected;
   third and fourth NMOS transistors connected to the first and second NMOS transistor, respectively, wherein a transconductance of each of the third and fourth NMOS transistors is controlled by a control voltage to generate various output currents;
   first and second loads for generating output voltages having variable gains depending on the currents outputted through the third and fourth NMOS transistors;
   a current source for supplying a given current;
   a first PMOS transistor driven by a bias voltage, for supplying the current from the current source;
   a second PMOS transistor driven by the control voltage, for supplying the current from the current source;
   fifth and sixth NMOS transistors connected between a connecting point of the second and third NMOS transistors and a ground terminal and between a connecting point of the first and fourth NMOS transistors and the ground terminal, respectively, and driven by the current supplied through the first PMOS transistor; and seventh and eighth NMOS transistors connected in parallel between the connecting point of the first and second NMOS transistors and the ground terminal and driven by the current supplied through the second PMOS transistor.

8. The variable gain amplifier as claimed in claim 7, wherein each of the first and second loads is a resistor.

9. The variable gain amplifier as claimed in claim 7, wherein each of the first and second loads comprises:

a PMOS transistor connected between a power supply terminal and an output terminal and driven by the potential of a first node;

a NMOS transistor connected between the output terminal and the first node and driven by the potential of the output terminal; and a capacitor and a current source each connected in parallel between the first node and the ground terminal.

* * * * *